United States Patent
Panat et al.

(10) Patent No.: US 9,627,320 B2
(45) Date of Patent: Apr. 18, 2017

(54) NANOWIRES COATED ON TRACES IN ELECTRONIC DEVICES

(75) Inventors: Rahul Panat, Chandler, AZ (US); Bhanu Jaiswal, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 32 days.

(21) Appl. No.: 13/976,008

(22) PCT Filed: Dec. 23, 2011

(86) PCT No.: PCT/US2011/067261
§ 371 (c)(1),
(2), (4) Date: Jun. 25, 2013

(87) PCT Pub. No.: WO2013/095663
PCT Pub. Date: Jun. 27, 2013

(65) Prior Publication Data
US 2015/0048508 A1    Feb. 19, 2015

(51) Int. Cl.
*H01L 23/485* (2006.01)
*H01L 23/532* (2006.01)
(Continued)

(52) U.S. Cl.
CPC ........ *H01L 23/53238* (2013.01); *B82Y 30/00* (2013.01); *H01L 21/02603* (2013.01); *H01L 21/7685* (2013.01); *H01L 21/76834* (2013.01); *H01L 23/49866* (2013.01); *H01L 29/0673* (2013.01); *H01L 21/02491* (2013.01); *H01L 21/02494* (2013.01); *H01L 21/02554* (2013.01); *H01L 21/02628* (2013.01); *H01L 2924/0002* (2013.01)

(58) Field of Classification Search
CPC ...................................................... B82Y 30/00
USPC ............... 438/605, 608, 622, 642, 674, 763; 257/751
See application file for complete search history.

(56) References Cited

U.S. PATENT DOCUMENTS

| 6,762,494 B1 | 7/2004 | Fazelpour et al. |
| 2003/0126742 A1* | 7/2003 | Ting et al. ...................... 29/874 |

(Continued)

FOREIGN PATENT DOCUMENTS

TW    I248469    2/2006

OTHER PUBLICATIONS

International Preliminary Report on Patentability (IPRP) for International Application No. PCT/US2011/067261, dated Jul. 3, 2014, 8 pp.
(Continued)

*Primary Examiner* — Marc Armand
*Assistant Examiner* — Sarah Salerno
(74) *Attorney, Agent, or Firm* — Konrad Raynes Davda & Victor LLP; Alan S. Raynes

(57) ABSTRACT

Methods and devices including the formation of a layer of nanowires on wiring line traces are described. One device comprises a first dielectric layer and a plurality of traces on the first dielectric layer, the traces comprising Cu. The traces include a layer of ZnO nanowires positioned thereon. A second dielectric layer is positioned on the first dielectric layer and on the traces, wherein the second dielectric layer is in direct contact with the ZnO nanowires. Other embodiments are described and claimed.

16 Claims, 3 Drawing Sheets

(51) Int. Cl.
*B82Y 30/00* (2011.01)
*H01L 21/02* (2006.01)
*H01L 29/06* (2006.01)
*H01L 23/498* (2006.01)
*H01L 21/768* (2006.01)

(56) References Cited

U.S. PATENT DOCUMENTS

| | | | | |
|---|---|---|---|---|
| 2008/0315430 | A1* | 12/2008 | Weber et al. | 257/774 |
| 2008/0318430 | A1* | 12/2008 | Park | 438/703 |
| 2009/0263568 | A1* | 10/2009 | Luhrs | B82Y 30/00 427/75 |
| 2010/0028633 | A1* | 2/2010 | O'Rourke | B82Y 10/00 428/210 |
| 2010/0207269 | A1 | 8/2010 | Kruglick | |
| 2011/0220171 | A1* | 9/2011 | Mathai et al. | 136/244 |

OTHER PUBLICATIONS

International Search Report and Written Opinion for International Application No. PCT/US2011/067261, dated Sep. 19, 2012, 11 pp.
Baeraky, T.A., "Microwave Measurements of Dielectric Properties of Zinc Oxide at High Temperature", Egypt. J. Solids, vol. 30, No. 1, 13-18 (2007) 6 pp.
Ehlert, G.J., et al., "Interaction of ZnO Nanowires with Carbon Fibers for Hierarchical Composites with High Interfacial Strength", Journal of Solid Mechanics and Materials Engineering, vol. 4, No. 11, 1687-1698 (2010) 12 pp.
Lazcano, P., "Oxygen Adsorption on Cu/ZnO(0001)—Zn", Physical Review B 77, 035435, © 2008 The American Physical Society, 8 pp.
Lin, Y., et al., "Increased Interface Strength in Carbon Fiber Composites through a ZnO Nanowire Interphase", Advance Functional Materials, 19, 2654-2660 (2009) 7 pp.
Shi, C.Y., et al., "Cu(In,GA)Se2 Solar Cells on Stainless-Steel Substrates Covered with ZnO Diffusion Barriers", Solar Energy Materials & Solar Cells, 93, 654-656 (2009) 3 pp.
Office Action 1 including Search Report for TW Application No. 101145663, dated Jan. 25, 2016, 8 pp. (w/English Translation of Search Report).
Office Action 2 and Search Report for TW Application No. 101145663, dated Jun. 27, 2016, 9 pp. (w/ English Translation of Search Report).

* cited by examiner

NANOWIRES COATED ON TRACES IN ELECTRONIC DEVICES

BACKGROUND

Signals in electronic devices may be carried by wiring line traces made of materials such as copper (Cu). As electronic devices are typically multilayered in structure, the traces may be sandwiched between dielectric layers. As the size and spacing between traces shrinks and the electrical signaling speed increases with each technology generation, problems due to interactions between adjacent traces, or interactions between the trace and the overlying dielectric layer, may lead to electrical and/or mechanical problems.

BRIEF DESCRIPTION OF THE DRAWINGS

Embodiments are described by way of example, with reference to the accompanying drawings, which are not drawn to scale.

DETAILED DESCRIPTION

Reference below will be made to the drawings wherein like structures may be provided with like reference designations. In order to show the structures of various embodiments most clearly, the drawings included herein include diagrammatic representations of electronic device and integrated circuit structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Certain embodiments relate to the formation of wiring line traces that offer improved electrical and mechanical properties. Such embodiments include the formation of nanowires on the traces. Certain embodiments as described herein include the formation of zinc oxide (ZnO) nanowires on traces formed from materials such as copper. The zinc oxide nanowire coated wiring traces display desirable electrical and mechanical properties. For instance, zinc oxide may act as a diffusion barrier for copper. In addition, the nanowires provide good adhesion between the trace and the overlying dielectric material.

Figure 1A:
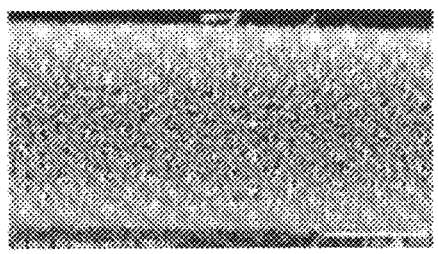
FIG. 1A illustrates a view of ZnO nanowires formed on a fiber.
Figure 1B:
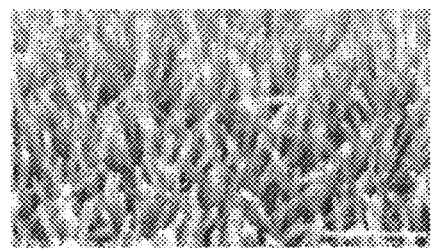
FIG. 1B illustrates a more magnified view of the nanowires of FIG. 1A.

FIG. 1A illustrates a photomicrograph of a layer of ZnO nanowires grown on a carbon fiber. FIG. 1B illustrates a more magnified view of the zinc oxide nanowires of FIG. 1A. The ZnO nanowires have a structure that includes a relatively large surface area.

As traces become closer and closer together, problems such as metal diffusion from one trace to another may arise. The diffusion of metal from one trace to another can lead to problems with shorting between the traces. By coating the wiring traces with ZnO nanowires, the diffusion of copper between traces may be inhibited, thus decreasing the risk of electrical shorting. This enables the traces to be formed closer together than would otherwise be possible.

During high speed signal transmission, the surface condition of the trace may be relevant to its ability to efficiently transmit current and limit signaling insertion loss. As the electrical input/output signaling gets faster, current tends to be concentrated at or near the skin (outer metal surface) of the trace due to skin effect. In general, it is observed that the smoother the skin, the less the signal insertion loss at high frequencies. However, if the skin is too smooth, there may be poor adhesion between the trace and the overlying dielectric layer. Poor adhesion may lead to voids/delamination and the like being formed in the structure, which can lead to both mechanical and electrical problems. Coating the trace with nanowires can enable the presence of a relatively smooth skin of metal for limiting signal insertion loss, while at the same time the nanowires provide enhanced mechanical coupling to the overlying dielectric layer. The rod-like structure of the plurality of nanowires acts to mechanically interlock the trace to the dielectric layer. This mechanical interlocking inhibits pull-away of the dielectric layer from the traces, thus improving the mechanical properties and reliability of the structure while enabling smoother traces for higher speed signal transmission.

Figure 2:
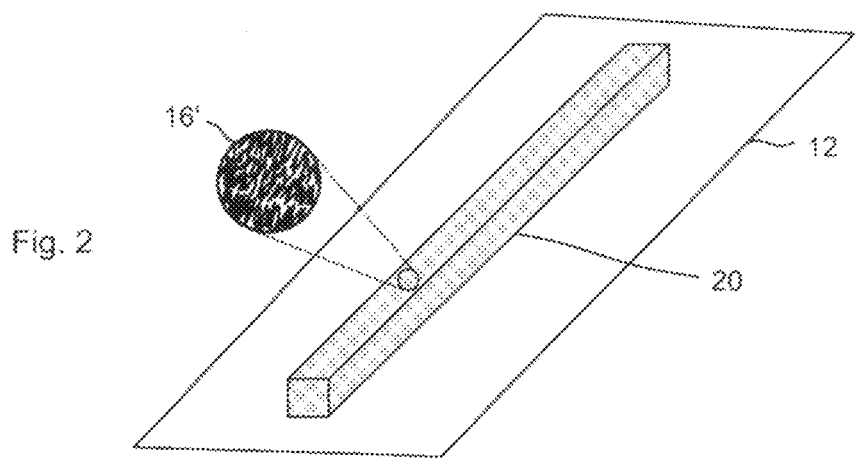
FIG. 2 illustrates a view of a nanowire coated trace on a dielectric layer, in accordance with certain embodiments.

FIG. 2 illustrates a view of a nanowire coated trace 20 on a substrate 12, in accordance with certain embodiments. The nanowire coated trace 20 may comprise a metal such as Cu having a layer of nanowires 16' extending outward from one or more surfaces thereof. As illustrated in FIG. 2 in the blown up portion, the nanowire coated trace 20 includes individual nanowires 16' that are formed on the surface of the metal of the trace. In the embodiment illustrated in FIG. 2, the nanowire coated trace 20 includes a plurality of surfaces having the nanowires 16' extending outward therefrom.

Figure 3A:
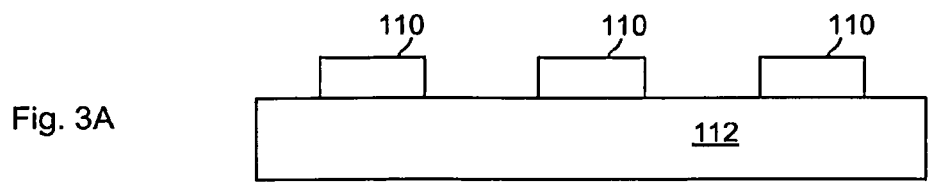
FIG. 3A illustrates a cross-sectional view of a substrate having a plurality of traces thereon, in accordance with certain embodiments.

FIGS. 3A-3D illustrate certain operations including the formation of nanowires on traces and a dielectric layer on the nanowire coated traces, in accordance with certain embodiments. FIG. 3A illustrates wiring traces 110 on a dielectric layer 112. The traces 110 may be formed from any suitable electrically conductive material, for example, a metal such as Cu. The term metal as used herein includes pure metals and alloys. The traces 110 may make electrical contact with layers below (and after subsequent processing of layers above) in order to transmit electrical signals through the device.

The dielectric layer 112 may be formed from any suitable insulating material, for example, a build-up layer such as Ajinomoto Build-up Film (ABF), available from Ajinomoto Fine-Techno Co., Inc. In certain embodiments, the dielectric material may be an epoxy with fillers. The traces may have a variety of geometries, including, but not limited to, a rectangular cross section as illustrated in FIG. 3A.

Figure 3B:
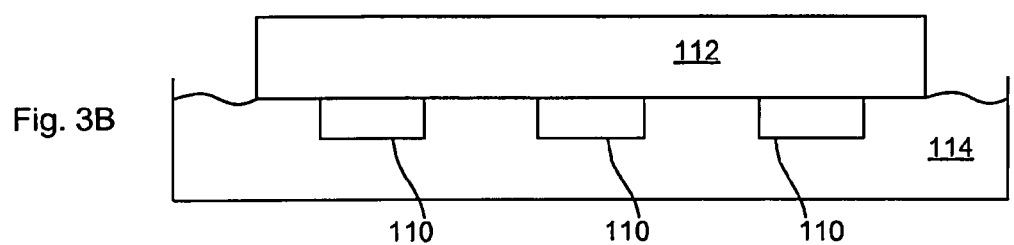
FIG. 3B illustrates a cross-sectional view of the traces of FIG. 2A being placed into a chemical bath, in accordance with certain embodiments.
Figure 3C:
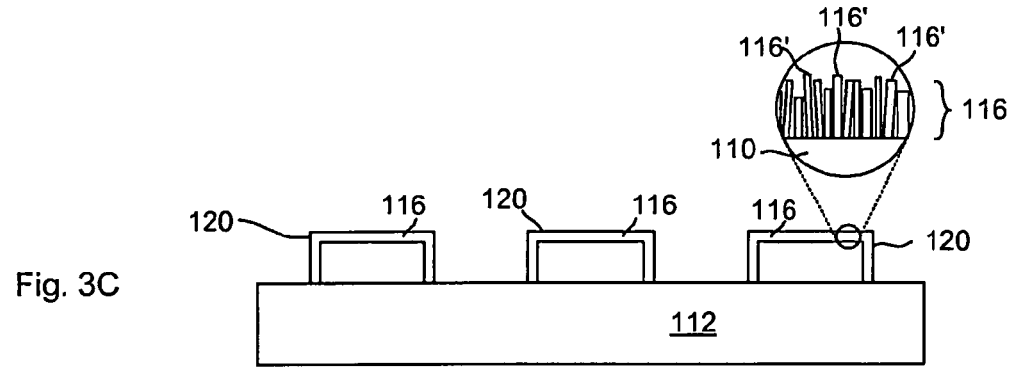
FIG. 3C illustrates a cross-sectional view of the traces of FIG. 2B with a nanowire coating formed thereon, in accordance with certain embodiments.

A nanowire layer 116 may be formed on the traces 110. The nanowire layer may be formed using any suitable method. In one suitable method, as illustrated in FIG. 3B, the traces 110 on the dielectric layer 112 may be dipped in a solution 114 in a bath-based process. The solution 114 may include zinc nitrate hydrate and hexamethylenetetramine (HMTA) and be kept at a temperature of about 90° C. Such conditions result in the growth of nanowire layer 116 on the traces 110, to form nanowire coated traces 120 as illustrated in FIG. 3C. The areas of the dielectric 112 not covered with traces 110 may be shielded from solution using a photolithographic film so that it does not get coated with the nanowires. This can be done using suitable photolithographic methods. In other embodiments, the nanowires may be coated on the exposed dielectric layer 112, with no added benefit or harm to the subsequent dielectric layer formations or to the functioning of the semiconductor package. As illustrated in the blown-up portion of FIG. 3C, the nanowire layer 116 includes a plurality of individual nanowires 116'. Using the chemicals above, the nanowire coated traces 120 will comprise individual ZnO nanowires 116' formed on the Cu traces 110, as illustrated in the blown up portion of FIG. 3C. In certain embodiments, the entire substrate 112 with traces may be immersed in the chemical bath to form the nanowire layer on the traces 110. Areas on the substrate not to be coated with the nanowires may be covered using suitable lithographic methods.

Figure 3D:
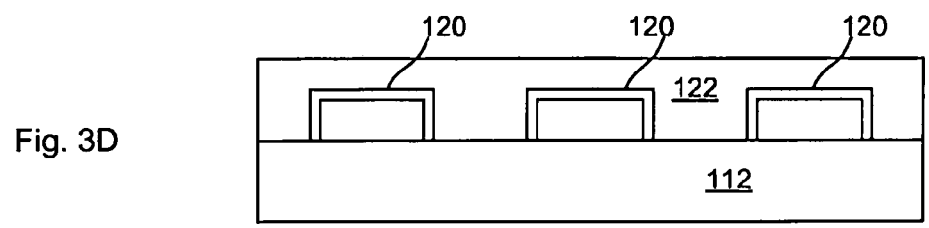
FIG. 3D illustrates a cross-sectional view of the nanowire coated traces of FIG. 2C with a dielectric layer deposited thereon, in accordance with certain embodiments.

The nanowires 116' may be sub-micron in size, with certain embodiments including a range of 100-1000 nm (nanometers) in length and 10-50 nm in diameter. Other sizes are also possible. The nanowires generally grow in a substantially perpendicular direction to the surface, as illustrated in FIG. 3C, though certain embodiments may have a different growth pattern. As illustrated in FIG. 3D, the next dielectric layer 122 may then be formed on the nanowire coated traces 120. The dielectric layer 122 may be formed from any suitable insulating material, including, but not limited to, polymers, for example, ABF, which is an organic resin with fillers.

Figure 4:
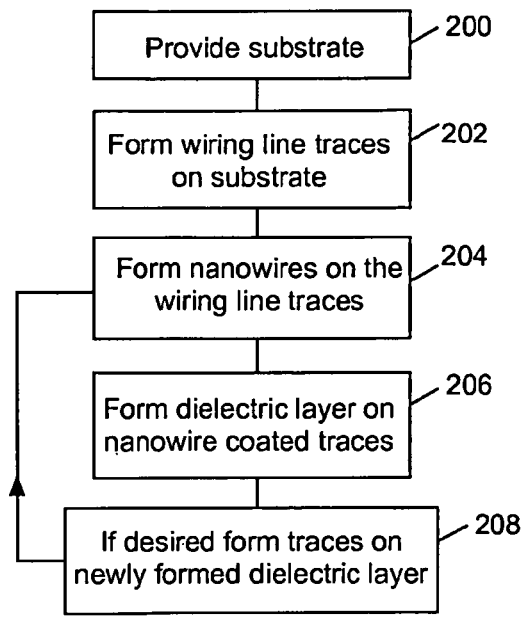
FIG. 4 illustrates a flowchart of operations for forming structures including nanowire coated traces, in accordance with certain embodiments.

A flowchart of operations in accordance with certain embodiments is set forth in FIG. 4. Box 200 is supplying a substrate. The substrate may be in the form of a panel of substrates. In certain embodiments the substrate comprises a dielectric layer such as a polymer with fillers. Box 202 is forming wiring line traces on the substrate. The traces may be formed on a dielectric layer and may be formed using any suitable procedure, including, but not limited to, deposition of a metal layer followed by masking and etching. Box 204 is forming nanowires on the wiring line traces, using a wet bath process such as described above or using any other suitable process for forming nanowires. The nanowires may be formed to have a morphology that is substantially rod-like in shape, through other shapes may also be possible. Box 206 is depositing a dielectric layer on the nanowire coated wiring line traces. Such a dielectric layer may be deposited so that there is a mechanical interlocking with the nanowires. This leads to a good bond between the dielectric layer and the traces. The dielectric layer may be formed from any suitable material, including, but not limited to polymers with fillers. Examples may include build-up materials such as ABF or a photoresist. Box 208 is forming additional wiring line traces on the dielectric layer that is on the coated wiring line traces, if desired, and then forming nanowires on the additional wiring line traces as in Box 204. Multiple layers of coated wiring lines may be formed with multiple dielectric layers. In certain embodiments, such layers may be laminated to form a multilayer structure.

It should be noted that the terms "trace", "traces", "wiring", "line" and combinations of these terms relate to the electrically conductive path extending in an electronic device. In certain embodiments, any metal structure where fine spacing is necessary may benefit from having the nanowire layer formed thereon.

The nanowires coated on the traces may in certain embodiments be formed from ZnO, but are not limited to ZnO. Other materials are also possible, as a variety of materials can be grown as nanowires in accordance with suitable procedures. ZnO has advantages, as noted above, of both forming the nanowire structure that enhances the mechanical connection between the dielectric and the trace, as well as acting as a diffusion barrier for the trace metal. In addition, a variety of electrically conducting materials may be used as trace materials in addition to Cu. One example of a metal that may be used as a trace material is silver (Ag).

Embodiments including coated wiring traces may include traces on a variety of substrates, including, but not limited to, package substrates, semiconductor substrates, and printed circuit board substrates. Moreover, coated traces may be used at a variety of levels within the devices, including those within a stack of layers and those on or near the outermost surface(s) of a body.

Embodiments including coated wiring traces may be used in a variety of structures have a variety of line widths and trace widths. For example, certain embodiments may be used for line spacings and line widths in the range of 1 to 10 μm (microns). Other line spacings and line widths, larger and smaller, are also possible.

Figure 5:
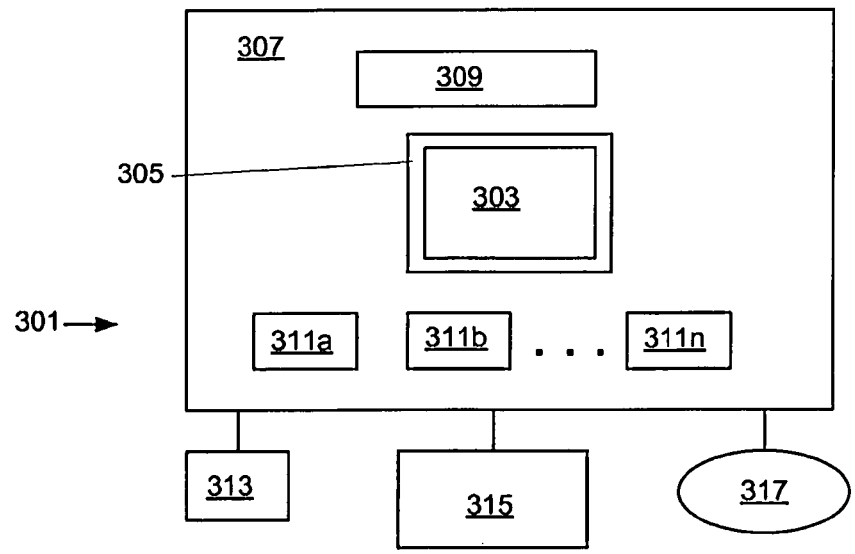
FIG. 5 illustrates an electronic system arrangement in which embodiments may find application.

Assemblies including structures formed as described in embodiments above may find application in a variety of electronic components. FIG. 5 schematically illustrates one example of an electronic system environment in which aspects of described embodiments may be embodied. Other embodiments need not include all of the features specified in FIG. 5, and may include alternative features not specified in FIG. 5.

The system 301 of FIG. 5 may include at least one central processing unit (CPU) 303. The CPU 303, also referred to as a microprocessor, may be a die attached to a package substrate 305, which is then coupled to a printed circuit board 307 (for example, a motherboard). The CPU 303, as well as the package substrate 305 and the printed circuit board 307, are examples of assemblies that may be formed in accordance with embodiments such as described above, to include wiring line traces including a nanowire layer. A variety of other system components, including, but not limited to memory and other components discussed below, may also include structures formed in accordance with embodiments such as described above.

The system 301 may further include memory 309 and one or more controllers 311a, 311b . . . 311n, which are also disposed on the motherboard 307. The motherboard 307 may be a single layer or multi-layered board which has a plurality of conductive lines that provide communication between the circuits in the package 305 and other components mounted to the board 307. Alternatively, one or more of the CPU 303, memory 309 and controllers 311a, 311b . . . 311n may be disposed on other cards such as daughter cards or expansion cards. The CPU 303, memory 309 and controllers 311a, 311b . . . 311n may each be seated in sockets or may be connected directly to a printed circuit board or all integrated in the same package. A display 315 may also be included.

Any suitable operating system and various applications execute on the CPU 303 and reside in the memory 309. The content residing in memory 309 may be cached in accordance with known caching techniques. Programs and data in memory 309 may be swapped into storage 313 as part of memory management operations. The system 301 may comprise any suitable computing device, including, but not limited to, a mainframe, server, personal computer, workstation, laptop, handheld computer, netbook, tablet, book reader, handheld gaming device, handheld entertainment device (for example, MP3 (moving picture experts group layer-3 audio) player), PDA (personal digital assistant) telephony, device (wireless or wired), network appliance, virtualization device, storage controller, network controller, router, etc.

The controllers 311a, 311b . . . 311n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 313 in accordance with a storage protocol layer. The storage protocol of the layer may be any of a number of known storage protocols. Data being written to or read from the storage 313 may be cached in accordance with known caching techniques. A network controller can include one or more protocol layers to send and receive network packets to and from remote devices over a network 317. The network 317 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

Terms such as "first", "second", and the like may be used herein and do not necessarily denote any particular order, quantity, or importance, but are used to distinguish one element from another. Terms such as "top", bottom", "upper", "lower", "overlying", and the like may be used for descriptive purposes only and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. An electronic device comprising:
a substrate,
a first electrically conductive region on the substrate, the first electrically conductive region comprising a trace including a metal layer;
a plurality of nanowires positioned on the trace, the plurality of nanowires each including a first end in direct contact with the metal layer and a second end that is electrically isolated from any additional electrically conductive regions comprising a trace on the substrate;
a first dielectric layer positioned in direct contact with the plurality of nanowires;
an additional trace comprising a metal layer positioned on the first dielectric layer, and a plurality of additional nanowires positioned on the additional trace, wherein the first dielectric layer is positioned between the additional trace and the plurality of nanowires, and wherein the first dielectric layer is positioned between the additional trace and the substrate; and
a second dielectric layer positioned on the plurality of additional nanowires, wherein the
second dielectric layer is separated from the substrate by at least the first dielectric layer.

2. The electronic device of claim 1, the trace including a top surface and first and second side surfaces, wherein the plurality of nanowires are positioned on the top surface and on the first and second side surfaces of the trace.

3. The electronic device of claim 2, wherein the plurality of nanowires extend outward from the top surface and from the first and second side surfaces in a substantially perpendicular manner.

4. The electronic device of claim 1, wherein the first dielectric layer comprises an organic polymer material with fillers.

5. The electronic device of claim 1, wherein the plurality of nanowires comprise zinc oxide.

6. The electronic device of claim 1, wherein the substrate comprises a semiconductor material and a substrate dielectric layer on the semiconductor material, wherein the trace is positioned on the substrate dielectric layer.

7. The electronic device of claim 1, wherein the plurality of nanowires each have a length of no greater than 1 μm and a diameter in the range of 10-50 nm.

8. The electronic device of claim 1, wherein the first dielectric layer is positioned so that the second end of each of the plurality of nanowires is electrically isolated from the additional trace on the substrate.

9. A method for forming an electronic device, comprising:
providing a substrate;
providing an electrically conductive region comprising a first trace on the substrate, the first trace comprising a metal layer;
growing a plurality of nanowires on the first trace, the nanowires each including a first end in direct contact with the metal layer and a second end spaced apart from the first end; and
positioning a first dielectric layer on the plurality of nanowires on the first trace so that the second end is electrically isolated from any additional electrically conductive regions comprising a trace by the first dielectric layer;
providing a second trace comprising a metal layer on the first dielectric layer, wherein the first dielectric layer is positioned between the second trace and the plurality of nanowires on the first trace;
growing an additional plurality of nanowires in direct contact with the metal layer of the second trace; and
providing a second dielectric layer on the additional plurality of nanowires on the second trace, wherein the second dielectric layer is separated from the substrate by at least the first dielectric layer.

10. The method of claim 9, comprising positioning the first dielectric layer to form a mechanically interlocked structure with at least some of the plurality of nanowires.

11. The method of claim 9, the trace including a top surface and first and second side surfaces, wherein the plurality of nanowires are positioned on the top surface and on the first and second side surfaces of the trace.

12. The method of claim 9, further comprising forming the plurality of nanowires to comprise zinc oxide.

13. An electronic device comprising:
a substrate;
a first electrically conductive region on the substrate, the first electrically conductive region comprising a trace comprising a metal layer;
a first layer of nanowires positioned on the trace and including a first end surface positioned on the trace and a second end surface opposite the first end surface;
a first dielectric layer positioned on the first layer of nanowires positioned on the trace, wherein the first dielectric layer is positioned to electrically isolate the first layer of nanowires from any additional electrically conductive regions comprising a trace on the substrate;
a second electrically conductive region on the first dielectric layer, the second electrically conductive region comprising a trace comprising a metal layer; the first dielectric layer positioned between the second electrically conductive region and the first layer of nanowires;
a second layer of nanowires positioned on the metal layer of the second electrically conductive region; and
a second dielectric layer positioned on the second layer of nanowires, wherein the second dielectric layer is separated from the substrate by at least the first dielectric layer.

14. The electronic device of claim 13, wherein the metal layer of the first electrically conductive region on the substrate includes a top surface and first and second side surfaces, wherein the first layer of nanowires is positioned in direct contact with the top surface and the first and second side surfaces of the metal layer of the first electrically conductive region.

15. The electronic device of claim 13, wherein the first layer of nanowires and the second layer of nanowires comprise zinc oxide.

16. The electronic device of claim 13, wherein the first layer of nanowires each have a length of no greater than 1 µm and a diameter in the range of 10-50 nm.

* * * * *